United States Patent
Bhardwaj

(10) Patent No.: US 10,379,148 B2
(45) Date of Patent: Aug. 13, 2019

(54) METHODS AND APPARATUS TO CONTROL INJECTION FOR FREQUENCY RESPONSE MEASUREMENT

(71) Applicant: TEXAS INSTRUMENTS INCORPORATED, Dallas, TX (US)

(72) Inventor: Manish Bhardwaj, Sugarland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/339,157

(22) Filed: Oct. 31, 2016

(65) Prior Publication Data
US 2018/0120365 A1 May 3, 2018

(51) Int. Cl.
*G01R 23/16* (2006.01)
*G01R 31/42* (2006.01)
*G01R 27/28* (2006.01)

(52) U.S. Cl.
CPC ............ *G01R 23/16* (2013.01); *G01R 27/28* (2013.01); *G01R 31/42* (2013.01)

(58) Field of Classification Search
CPC .................................. G01R 23/16; G01R 31/42
See application file for complete search history.

(56) References Cited

U.S. PATENT DOCUMENTS

| | | | |
|---|---|---|---|
| 5,369,345 A * | 11/1994 | Phan | G05B 13/042 318/561 |
| 6,546,296 B1 * | 4/2003 | Hara | G05B 13/024 360/69 |
| 7,019,505 B2 * | 3/2006 | Dwarakanath | H02M 3/157 323/283 |
| 8,259,542 B1 * | 9/2012 | Zheng | G11B 7/0941 369/124.12 |
| 8,780,489 B1 * | 7/2014 | Gayaka | G11B 5/59627 360/78.05 |
| 9,052,701 B1 * | 6/2015 | Jia | G05B 5/01 |
| 9,837,114 B1 * | 12/2017 | Takaishi | G11B 20/10027 |
| 2005/0091006 A1 * | 4/2005 | Rober | G01C 19/56 702/189 |

(Continued)

OTHER PUBLICATIONS

Bhardwaj et al., "Online Frequency Response Analysis: A Powerful Plug-in Tool for Compensation Design & Health Assessment of Digitally Controlled Power Converters," Institute of Electrical and Electronics Engineers, 2014 (6 pages).

(Continued)

*Primary Examiner* — Huy Q Phan
*Assistant Examiner* — Zannatul Ferdous
(74) *Attorney, Agent, or Firm* — Kenneth Liu; Charles A. Brill; Frank D. Cimino

(57) ABSTRACT

Methods, apparatus, systems and articles of manufacture to control injection for frequency response measurement. An example method includes calculating a gain of a circuit. The gain is calculated based on a measured response of the circuit to a first disturbance injected at a first frequency. A second frequency at which a second disturbance is to be injected into the circuit is identified. An amplitude at which the second disturbance is to be injected into the circuit at the second frequency is calculated. The amplitude calculated based on a measurement noise and the gain of the circuit at the first frequency. The second disturbance is injected into the circuit using the second frequency and the amplitude.

22 Claims, 6 Drawing Sheets

(56) References Cited

U.S. PATENT DOCUMENTS

2016/0378077 A1* 12/2016 Iijima ................ G05B 13/0265
318/561
2018/0159297 A1* 6/2018 Ahlawat ................ H01S 3/106

OTHER PUBLICATIONS

Bhardwaj et al., "Online Frequency Response Analysis: A Powerful Plug-in Tool for Compensation Design & Health Assessment of Digitally Controlled Power Converters," IEEE Transactions on Industry Applications, vol. 52, No. 3, May/Jun. 2016 (10 pages).
"PowerSUITE Digital Power Supply Software Frequency Response Analyzer Tool for C2000(tm) MCUs," http://www.ti.com/tool/sfra, retrieved on Oct. 31, 2016 (3 pages).
Texas Instruments, "C2000(tm) Software Frequency Response Analyzer (SFRA) Library and Compensation Designer: User's Guide," Literature No. SPRUHZ5A, Feb. 2015 (52 pages).

* cited by examiner

METHODS AND APPARATUS TO CONTROL INJECTION FOR FREQUENCY RESPONSE MEASUREMENT

FIELD OF THE DISCLOSURE

This disclosure relates generally to frequency response measurement, and, more particularly, to methods and apparatus to control injection for frequency response measurement.

BACKGROUND

Power supply designers seek to design power converters that are stable. While power supply designers prepare models and check frequency response from these models for designed power converter circuitry to confirm stability, such models do not account for all the potential disturbances in the system and can be error prone. As a result, power supply designers prefer to measure the frequency response of the power supply circuit to verify the modeling, and ensure stability of the power supply circuit. Additionally, for power stages whose model can be complex to calculate, a black box approach based on just the frequency response measurement can be used to verify stability of the system.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1:
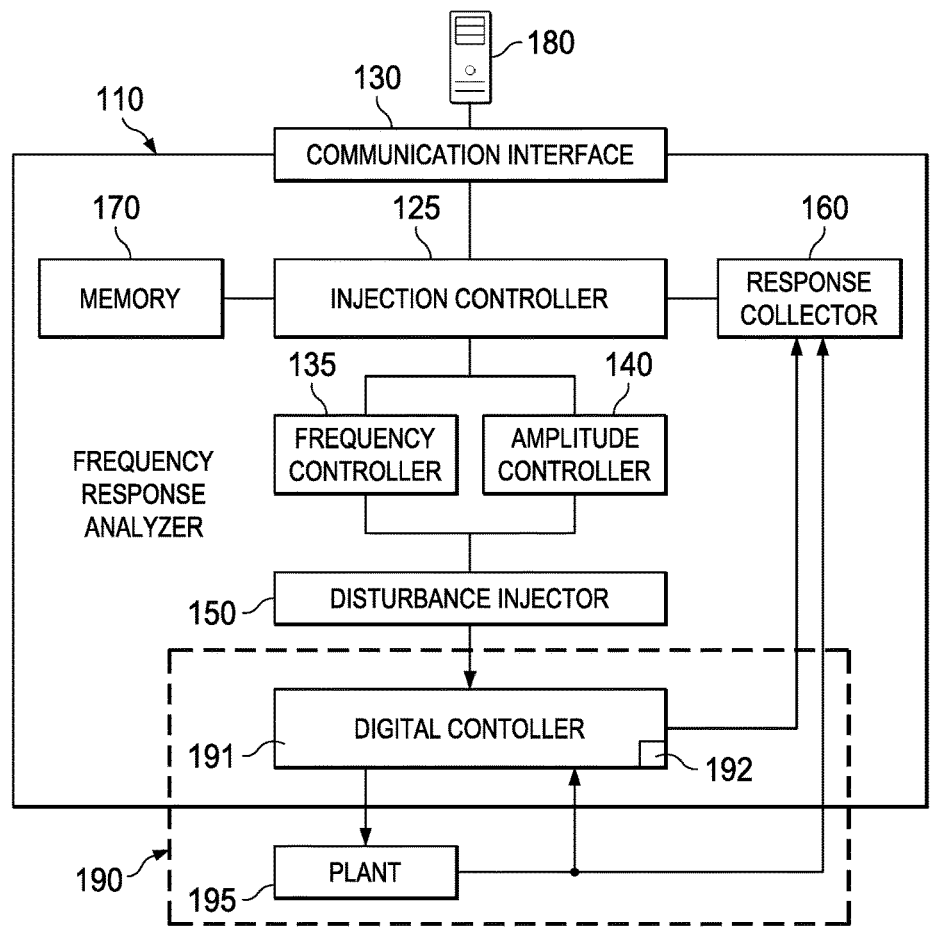
FIG. 1 is a block diagram of an example frequency response analyzer to control injection for frequency response measurement.

To ensure stability and desired performance of a plant, control engineers implement compensator(s) to adjust the input to the plant, thus constructing a closed loop system. Selection of the compensator is driven by the need of the system to be stable and also to meet desired performance characteristics such as settling time, overshoot etc. Frequency response of the open loop gain (GH) is a well accepted parameter used to judge the stability of the system, but can be difficult to measure because the plant (H) is unknown. Designers can create mathematical models to get the information of H. However, theoretical models do not take into account all potential disturbances and/or variations (e.g., parasitics) in the system, and can be error prone. The frequency response of the plant circuit H can be directly measured by injecting a small signal disturbance into the closed loop system or the open loop system and sweeping the frequency of the injection across the range of interest for control design. As the Plant (H) and Open Loop (GH) gain is not constant across the frequency sweep spectrum, the output disturbance in the output due to the small signal injection can vary from one end of the frequency spectrum to the other. It is desirable to reduce the output disturbance such that it does not disrupt operation of the system under test. In existing systems, the amplitude of the small signal injection added to the circuit is fixed across the range of frequencies. Unfortunately, due to variations in open loop gain across the frequency sweep, the disturbance caused by a constant injection on the output will vary and can disrupt operation of the circuit under test and/or create measurement noise (thereby degrading the quality of the measurement).

Examples disclosed herein adapt the amplitude of the injected signal based on prior frequency sweep data (e.g., frequency response measurements within a frequency sweep, information from prior sweeps, etc.). For example, during a frequency sweep, the amplitude to be used at a frequency N is computed using the measured response at a frequency N−1. As a result, the amplitude of the injected sinusoidal signal is controlled to prevent large disturbance at the output which can also artificially introduce instability in the circuit under test.

Examples disclosed herein enable frequency response analysis of digitally controlled power converters without the need for an external frequency response analyzer. The example frequency response analyzer disclosed herein enables identification of plant and open loop characteristics of a closed loop power converter. Such characteristics can be used to determine stability information of the closed loop power converter such as bandwidth, gain margin, and phase margin. Example design objectives for stability of a closed loop power converter might include, for example, ensuring that the closed loop power converter tracks a reference voltage asymptotically, ensuring that input disturbances are appropriately rejected, etc.

The results of the frequency sweep can be used to facilitate design of compensator coefficients used in the digitally controlled power converter. Such coefficients can then be programmed to the digitally controlled power converter, and the frequency analysis may be performed again to re-validate the design of the digitally controlled power converter.

FIG. 1 is a block diagram of an example frequency response analyzer 110 to control injection for frequency response measurement. The example frequency response analyzer 110 includes an injection controller 125, a communication interface 130, a frequency controller 135, an amplitude controller 140, a disturbance injector 150, a response collector 160, and a memory 170. The example frequency response analyzer 110 communicates with an external computer system 180 to facilitate presentation of results of the frequency response analysis to a user, as well as receipt of instructions concerning a frequency response analysis to be performed by the frequency response analyzer 110. The example frequency response analyzer 110 performs a frequency response analysis against an example digitally controlled power converter 190.

The example injection controller 125 of the illustrated example of FIG. 1 causes the disturbance injector 150 to output an injection to the digitally controlled power converter 190. The example injection controller 125, via the response collector 160, measures the response of the digitally controlled power converter 190, and computes an open loop response and a plant response for each measured frequency in the configured sweep of frequencies. Such open loop response information and plant response information can be used to, for example, verify a plant model (H), extract the plant model (H), design a compensator (G) for the closed loop plant, verify a closed loop performance of the digitally controlled power converter, etc. As the sweep is being performed, the open loop response information and/or the plant response information can be used to determine an amplitude to be used for an injection at a next frequency to be tested. As the sweep is being performed, the open loop response information and/or the plant response information are stored in the example memory 170. Upon completion of the sweep, the results stored in the example memory 170 may be provided to the external computer system 180 via the example communication interface 130.

The example communication interface 130 of the illustrated example of FIG. 1 enables the frequency response analyzer 110 to communicate with external systems such as, for example the external computer system 180. In examples disclosed herein, the example communication interface is implemented using a serial communication port. In examples disclosed herein, the communication interface 130 utilizes serial communication protocols such as, for example, RS-232, RS-422, RS-485, etc. to communicate with the external computer system 180. However, any other past, present, and/or future protocol(s) and/or communication system(s) for communicating with external computer systems may additionally or alternatively be used such as, for example, Ethernet communications, Bluetooth communications, etc.

In examples disclosed herein, the communication interface 130 enables frequency analysis parameters to be received from the example computer system 180. Example frequency analysis parameters may include, for example, a start frequency of a frequency analysis to be performed, a number of frequencies to be tested, a difference between the frequencies to be tested, an indication of whether automatic injection amplitude is to be utilized, a starting injection amplitude to be utilized, etc. However, frequency analysis parameters may be conveyed in any other fashion. For example, instead of indicating a start frequency, a number of frequencies, and a difference between each successive frequency, a list of frequencies to be tested may be provided. In some examples, the frequency analysis parameters instruct the injection controller 125 to begin a frequency analysis.

In examples disclosed herein, the example communication interface 130 enables results of the frequency analysis to be communicated to the example computer system 180. In some examples, the results are transmitted using a comma separated format (CSV). However, any other past, present, and/or future result format may additionally or alternatively be used such as, for example, a spreadsheet format (e.g., Microsoft® Excel®), a web page format (e.g., Hypertext Markup Language (HTML)), an extensible markup language (XML) format, etc. In some examples, the results include, for example, an open loop transfer function measurement and a plant measurement for each corresponding frequency of the frequency analysis. However, any other values may be reported such as, for example, the amplitude of the injection utilized by the frequency response analyzer 110.

The example frequency controller 135 of the illustrated example of FIG. 1 selects a frequency to be tested when performing a frequency sweep. In examples disclosed herein, the example frequency controller 135 initializes a step index that is incremented upon each successive frequency step. In examples disclosed herein, the example step index is initialized to zero. However, any other initial index value may additionally or alternatively be used. The example frequency controller calculates a frequency to be tested by multiplying the difference between each successive frequency step by the step index and adding the initial frequency to be tested. The frequency to be tested is passed to the disturbance injector 150.

The example amplitude controller 140 of the illustrated example of FIG. 1 calculates an amplitude to be used by the disturbance injector 150. In examples disclosed herein, the example amplitude controller 140 determines whether automatic injection control is to be used and, if so, a mode of the automatic injection control. If a plant-based mode is to be used, the example amplitude controller 140 determines the amplitude based on a measurement noise (e.g., noise encountered at the response collector 160) and the plant response (H) for the previous frequency step (N−1). In some examples, the measurement noise (e.g., an analog to digital converter (ADC) noise floor value) is a known property of the example response collector 160. However, in some other examples, the measurement noise is a derived value (e.g., based on a signal to noise ratio) of the response collected at the response collector 160. In some examples, a scaling factor is applied to the measurement noise. If an open loop-based mode is to be used, the example amplitude controller 140 determines the amplitude based on the measurement noise and the open loop response (GH) for the previous frequency step (N−1). In some examples, when utilizing the open loop-based mode, the example amplitude controller 140 determines the amplitude based on the measurement noise, the plant response (H) for the previous frequency step (N−1), and the anticipated compensator response (G) for the next frequency step (N+1).

In some examples, the example amplitude controller 140 clamps the amplitude to maximum and/or minimum output disturbance thresholds. For example, if the amplitude controller 140 determines that the amplitude exceeds a maximum threshold, the example amplitude controller 140 sets the amplitude to the maximum threshold. Likewise, if the amplitude controller 140 determines that the amplitude does not meet a minimum threshold, the example amplitude controller 140 sets the amplitude to the minimum threshold. In examples disclosed herein, the maximum threshold is 0.05 and the minimum threshold is 0.0005. However, any other maximum and/or minimum threshold(s) may additionally or alternatively be used. While in examples disclosed herein, both maximum clamping and minimum clamping are used, in some examples, maximum and/or minimum clamping may be omitted.

The example disturbance injector 150 of the illustrated example of FIG. 1 outputs a sinusoidal waveform having an amplitude identified by the amplitude controller 140 at the frequency identified by the frequency controller 135. The sinusoidal waveform causes a response in the digitally controlled power converter 190, which can be measured by the response collector 160.

The example response collector 160 of the illustrated example of FIG. 1 measures a response of the digitally controlled power converter 190. In examples disclosed herein, the example response collector 160 is implemented by an analog to digital converter (ADC). The sampling frequency of the ADC is configured such that it is greater than the double of the maximum frequency of the frequency sweep to be performed, and most typically the control or switching frequency of the converter, by the frequency response analyzer 110. However, any other approach to measuring a response of the digitally controlled power converter 190 may additionally or alternatively be used. In some examples, ADC noise is created by the response collector 160. ADC noise results in a lower limit on the value of the injection amplitude that can result in a measurable response to the injection.

The example memory 170 of the illustrated example of FIG. 1 is implemented by a memory for storing information (e.g., a frequency of an injected disturbance, an open loop response to the injection, a plant response to the injection, etc.) The example memory 170 of the illustrated example of FIG. 1 may be any device for storing data such as, for example, flash memory, magnetic media, etc. In the illustrated example, the example memory 170 is implemented by random access memory of the frequency response analyzer 110. Furthermore, the data stored in the example memory 170 may be in any data format such as, for example, binary data, comma delimited data, tab delimited data, structured query language (SQL) structures, etc. While in the illustrated example the memory 170 is illustrated as a single element, the example memory 170 may be implemented by multiple memory elements, and/or be stored in multiple memory locations of the example frequency response analyzer 110.

The example external computer system 180 of the illustrated example of FIG. 1 is a desktop computer. However, the external computer system 180 may be implemented in any other fashion. In examples disclosed herein, the example external computer system 180 provides a user interface to enable a user to select parameters of the frequency analysis (e.g., a starting frequency, a number of frequency steps to be tested, a difference between each successive frequency step to be tested, etc.) In examples disclosed herein, the user interface of the external computer system 180 displays results of the frequency analysis performed by the frequency response analyzer 110. In examples disclosed herein, the results are displayed using a bode plot. However, any other approach to displaying results of a frequency analysis may additionally or alternatively be used such as, for example, a spreadsheet. In examples disclosed herein, the example external computer system 180 communicates via the communication interface 130 of the frequency response analyzer 110 using a serial bus connection. However, any other approach to transmitting and/or receiving data to/from the frequency response analyzer 110 may additionally or alternatively be used.

Figure 2:
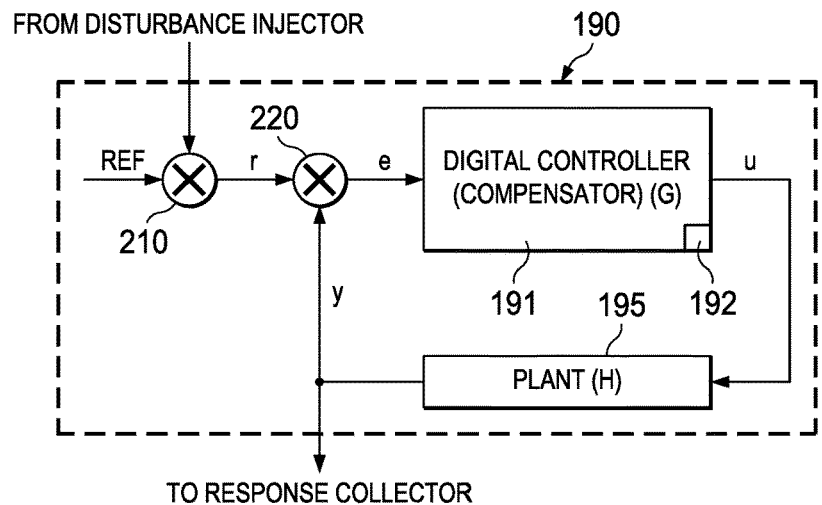
FIG. 2 is a block diagram of an example implementation of the example digitally controlled power converter of FIG. 1

The example digitally controlled power converter 190 of the illustrated example of FIG. 1 is implemented by a digital controller 191 that utilizes operating characteristics stored in a memory 192, rather than set by discrete components (e.g., resistors, capacitors, inductors, etc.) to control a response of a plant 195. In examples disclosed herein, operating characteristics can be stored in the memory 192 and be utilized by the digital controller 191 to, for example, control a feedback loop of the plant 195. FIG. 2 is a block diagram of an example implementation of the example digitally controlled power converter 190 of FIG. 1. The example digitally controlled power converter 190 of FIG. 2 includes a first mixer 210, a second mixer 220, the digital controller 191 (also referred to as a compensator), and the plant 195. A reference voltage is received by the first mixer 210 and is combined with an input received from the disturbance injector 150 of FIG. 1. The first mixer 210 creates an output r, which is combined with an output y of the plant 195 by the second mixer 220. The second mixer 220 creates an output e which is passed to the digital controller (compensator) 191. The digital controller (compensator) 191, based on the input e and the operating characteristics stored in the memory 192, controls operation of the plant 195. In examples disclosed herein, the plant 195 creates the output y, which is transmitted to the second example mixer 220 and the example response collector 160 of FIG. 1. While the example digitally controlled power converter 190 of FIG. 2 is arranged such that the digital controller 191 provides an input to the plant 195, the example digitally controlled power converter 190 may be arranged in any other fashion.

The example first mixer 210 of the illustrated example of FIG. 2 is implemented by a digital mixer that adds a reference signal to the disturbance received from the disturbance injector 150 of FIG. 1. However, the example first mixer 210 may be implemented in any fashion. The example second mixer 220 of the illustrated example of FIG. 2 is implemented by a digital mixer that adds the output of the first example mixer 210 (r) to the output of the plant 195 (y). However, the example second mixer 220 may be implemented in any fashion. In some examples, the first example mixer 210 and the second example mixer 220 are implemented as a single mixer.

The example digital controller (compensator) 191 of the illustrated example of FIG. 2 is a device introduced into the feedback loop between the output (e) of the second example mixer 220 and the input (y) of the second example mixer 220 (e.g., via the plant 195). The example digital controller (compensator) 191 controls operation of the plant 195 to ensure that the plant operates in a stable fashion and/or operates with a desired performance. In examples disclosed herein, the example digital controller (compensator) 191 is implemented by a digital filter, and utilizes filter coefficients stored in the memory 192. However, any other type of compensator may additionally or alternatively be used such as, for example, an analog filter implemented using discrete components (e.g., resistors, capacitors, inductors, etc.). In examples disclosed herein, the example digital controller (compensator) 191 is represented by a transfer function G.

The example plant 195 of the illustrated example is implemented by a circuit. In examples disclosed herein, the plant 195 is implemented by a buck power converter, and converts an input voltage to an output voltage. However, the example plant 195 may be implemented by any other circuit. In examples disclosed herein, the example plant 195 may exhibit an undesirable performance characteristic (e.g., an instability under certain circumstances, an undesirable phase shift, an undesirable gain, etc.) that is to be controlled and/or corrected by the digital controller (compensator) 191. In examples disclosed herein, the example plant 195 is represented by a transfer function H.

While an example manner of implementing the frequency response analyzer 110 is illustrated in FIG. 1, one or more of the elements, processes and/or devices illustrated in FIG. 1 may be combined, divided, re-arranged, omitted, eliminated and/or implemented in any other way. Further, the example injection controller 125, the example communication interface, the example frequency controller 135, the example amplitude controller 140, the example disturbance injector 150, the example response collector 160, the example memory 170, and/or more generally, the example frequency response analyzer 110 of FIG. 1 may be implemented by hardware, software, firmware and/or any combination of hardware, software and/or firmware. Thus, for example, any of the example injection controller 125, the example communication interface, the example frequency controller 135, the example amplitude controller 140, the example disturbance injector 150, the example response collector 160, the example memory 170, and/or more generally, the example frequency response analyzer 110 of FIG. 1 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example injection controller 125, the example communication interface, the example frequency controller 135, the example amplitude controller 140, the example disturbance injector 150, the example response collector 160, the example memory 170, and/or more generally, the example frequency response analyzer 110 of FIG. 1 is/are hereby expressly defined to include a tangible computer readable storage device or storage disk such as a memory, a digital versatile disk (DVD), a compact disk (CD), a Blu-ray disk, etc. storing the software and/or firmware. Further still, the example frequency response analyzer 110 of FIG. 1 may include one or more elements, processes and/or devices in addition to, or instead of, those illustrated in FIG. 1, and/or may include more than one of any or all of the illustrated elements, processes and devices.

Figure 3:
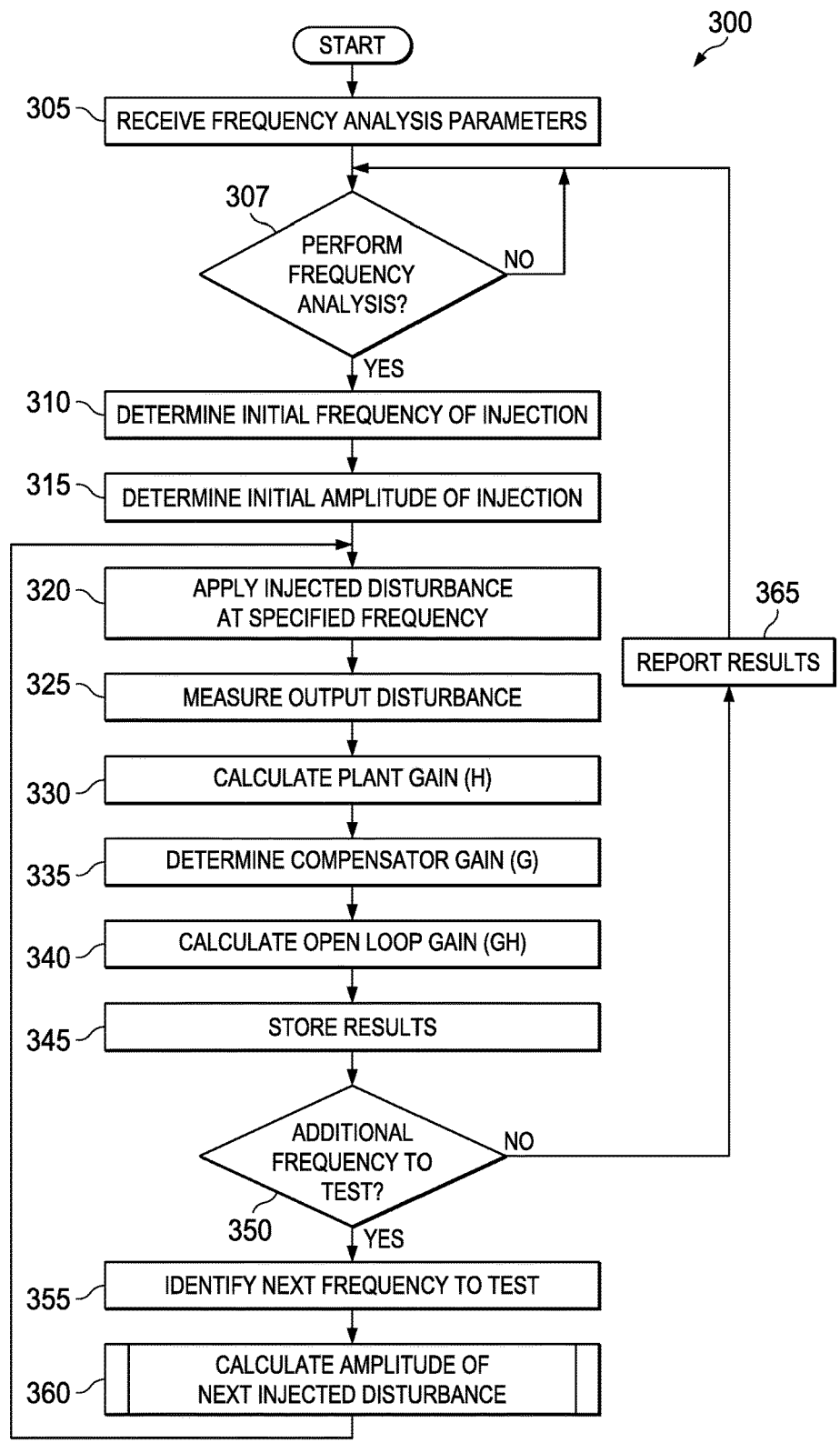
FIG. 3 is a flowchart representing example machine readable instructions that, when executed, cause the example frequency response analyzer of FIG. 1 to perform a frequency response measurement of the example digitally controlled power converter of FIGS. 1 and/or 2.

Flowcharts representative of example machine readable instructions for implementing the frequency response analyzer 110 of FIG. 1 are shown in FIGS. 3 and/or 4. In these examples, the machine readable instructions comprise a program for execution by a processor such as the processor 712 shown in the example processor platform 700 discussed below in connection with FIG. 7. The program may be embodied in software stored on a tangible computer readable storage medium such as a CD-ROM, a floppy disk, a hard drive, a digital versatile disk (DVD), a Blu-ray disk, or a memory associated with the processor 712, but the entire program and/or parts thereof could alternatively be executed by a device other than the processor 712 and/or embodied in firmware or dedicated hardware. Further, although the example program is described with reference to the flowcharts illustrated in FIGS. 3 and/or 4, many other methods of implementing the example frequency response analyzer 110 may alternatively be used. For example, the order of execution of the blocks may be changed, and/or some of the blocks described may be changed, eliminated, or combined.

As mentioned above, the example processes of FIGS. 3 and/or 4 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 3 and/or 4 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 3 is a flowchart representing example machine readable instructions that, when executed, cause the example frequency response analyzer 110 of FIG. 1 to perform a frequency response measurement of the example digitally controlled power converter 190 of FIGS. 1 and/or 2. The example program 300 of FIG. 3 begins at block 305 when the example injection controller 125 receives frequency analysis parameters from the external computer system 180 via the example communication interface 130 (block 305). In examples disclosed herein, the example injection controller 125 receives a mode of operation, a frequency vector length, a start frequency, a number of steps per decade, an indication of whether automatic injection amplitude control is to be used (and/or a starting amplitude to be used when using automatic injection amplitude control), a disturbance limit, etc. The example injection controller 125 stores the frequency analysis parameters in the example memory 170.

The example injection controller 125 determines whether a frequency analysis is to be performed (block 307). In some examples, the example injection controller 125 determines that a frequency analysis is to be performed upon receipt of the frequency analysis parameters. However, in some examples, frequency analysis might be performed periodically (e.g., every ten minutes, every hour, etc.) and/or or may be performed upon completion of a prior frequency analysis. If the example injection controller 125 determines that the frequency analysis is not to be performed (e.g., block 307 returns a result of NO), control proceeds to block 307 where the example injection controller 125 continues to determine whether to perform the frequency analysis. In some examples, the example injection controller 125 may wait before repeating the determination of whether to perform the frequency analysis.

If the example injection controller 125 determines that the frequency analysis is to be performed (e.g., block 307 returns a result of YES), the example frequency controller 135 determines an initial frequency of the injection (block 310). In some examples, the example frequency controller 135 initializes a step index to facilitate identification of how which frequency step is being tested. In examples disclosed herein, the initial frequency is provided as part of the frequency analysis parameters. However, in some examples, the example frequency controller 135 may calculate the initial frequency based on the frequency analysis parameters.

The example amplitude controller 140 determines an initial amplitude of the injection (block 315). In examples disclosed herein, the example amplitude controller 140 determines the initial amplitude of the injection based on the frequency analysis parameters provided in connection with block 305. However, the initial amplitude of the injection may be identified in any other fashion.

Using the frequency identified by the frequency controller 135 and the amplitude identified by the amplitude controller 140, the example disturbance injector 150 injects a disturbance into the digitally controlled power converter 190 (block 320). In examples disclosed herein, the injection is a sinusoid waveform. However, any other type(s) of waveform(s) may additionally or alternatively be used. The example response collector 160 measures the output disturbance (block 325).

The example injection controller 125 calculates the plant gain (H) (block 330). In examples disclosed herein, the plant gain is calculated using the following equation:

$$H = \frac{y}{u} \Rightarrow H = \frac{(y_r + jy_i)}{(u_r + ju_i)} = \frac{(y_r u_r + y_i u_i)}{(u_r^2 + u_i^2)} + j\frac{(y_i u_r - y_r u_i)}{(u_r^2 + u_i^2)} \quad \text{Equation 1}$$

In the example equation 1, above, y represents the output of the plant 195 of FIG. 2, and u represents the input of the plant 195 of FIG. 2. $y_r$ represents the real portion of the output of the plant 195, and $y_i$ represents the imaginary portion of the output of the plant 195. Likewise, $u_r$ represents the real portion of the input of the plant 195, and $u_i$ represents the imaginary portion of the input of the plant 195. However, any other approach to calculating the plant gain (H) may additionally or alternatively be used.

The example injection controller 125 determines the compensator gain (G) (block 335). In examples disclosed herein, the compensator gain is calculated using known parameters of the compensator (e.g., filter coefficients stored in the memory 192). However, any other approach to calculating the compensator gain (G) may additionally or alternatively be used.

The example injection controller 125 calculates the open loop gain (GH) (block 340). In examples disclosed herein, the open loop gain is calculated using the following equation:

$$y = \frac{GH}{(1+GH)}r \Rightarrow GH = \frac{y}{r-y} \quad \text{Equation 2}$$

In the example equation 2, above, y represents the output of the plant 195 of FIG. 2, and r represents the input of the second example mixer 220 of FIG. 2. Equation 2 can further be expanded and written as:

$$GH = \frac{(y_r + jy_i)}{(jr_i - (y_r + jy_i))} = \frac{-(y_r^2 - y_i(r_i - y_i))}{y_r^2 + (r_i - y_i)^2} - j\frac{(y_r y_i + (r_i - y_i))}{y_r^2 + (r_i - y_i)^2} \quad \text{Equation 3}$$

In the example equation 3, above, $y_r$ represents the real portion of the output of the plant 195, and $y_i$ represents the imaginary portion of the output of the plant 195. $r_i$ represents the imaginary portion of the input of the second example mixer 220 of FIG. 2. However, any other approach to calculating the open loop gain (GH) may additionally or alternatively be used.

The example injection controller 125 stores the results of the calculation of the plant gain (block 330), the compensator gain (block 335), and the open loop gain (block 340) in the memory 170 (block 345). In examples disclosed herein, the injection controller stores the gains in connection with the tested frequency. However, the gains may be stored in any fashion.

The example injection controller 125 determines whether any additional frequencies exist to be tested (block 350). In examples disclosed herein, the example injection controller 125 determines that additional frequencies exist to be tested based on the frequency analysis parameters. If an additional frequency exists to be tested (e.g., block 350 returns a result of YES), the example frequency controller 135 identifies a next frequency to test (block 355). In some examples, the step index identifying the frequency step to be tested is incremented. In examples disclosed herein, the tested frequencies are incremented to implement a frequency sweep from a starting frequency to an ending frequency. In examples disclosed herein, the starting frequency is less than the ending frequency (i.e., an increasing frequency sweep). However, any other type of frequency sweep may additionally or alternatively be used such as, for example, a frequency sweep where the starting frequency is greater than the ending frequency (i.e., a decreasing frequency sweep).

The example amplitude controller 140 calculates an amplitude to be used for the injected disturbance at the next frequency step (block 360). In examples disclosed herein, the amplitude controller 140 calculates the amplitude based on the response of the digitally controlled power converter 190 at a prior frequency step, and an output disturbance limit. An example approach for calculating the amplitude to be used for the next injected disturbance is disclosed in connection with FIG. 4. Control then returns to block 320, where the process of blocks 320 through 360 is repeated to perform a complete frequency sweep.

When the frequency sweep is complete (e.g., block 350 returns a result of NO), the example injection controller 125 reports the results of the frequency sweep stored in the memory 170 to the external computer system 180 via the communication interface 130 (block 365). In some examples, the example injection controller 125 does not report the results to the external computer system 180. For example, the results may remain stored in the memory 170 until requested by the external computer system 180. Moreover, in some examples, the example injection controller 125 might report results of the frequency sweep as the frequency sweep is being performed (e.g., partial results of the frequency sweep might be reported when those results are stored in the memory in connection with block 345). Control then proceeds to block 307, where the example injection controller 125 determines whether a subsequent frequency analysis is to be performed.

Figure 4:
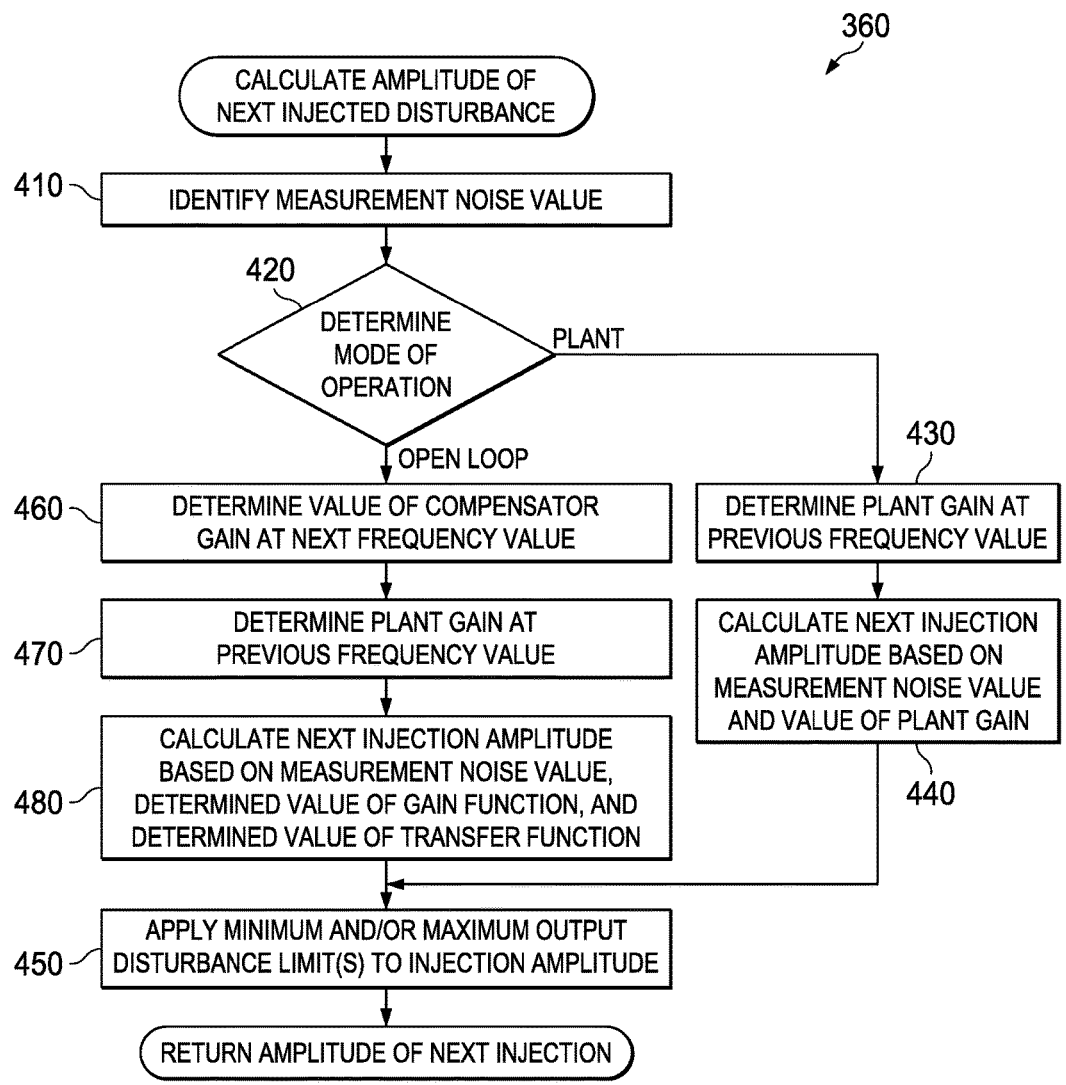
FIG. 4 is a flowchart representing example machine readable instructions that, when executed, cause the example frequency response analyzer of FIG. 1 to automatically control an amplitude of an injection used in the example frequency response measurement of FIG. 3.

FIG. 4 is a flowchart representing example machine readable instructions that, when executed, cause the example frequency response analyzer 110 of FIG. 1 to automatically control an amplitude of an injection used in the example frequency response measurement of FIG. 3. The example program 360 of FIG. 4 begins at block 410 when the example amplitude controller identifies a measurement noise value (block 410). In examples disclosed herein, the example measurement noise value is stored in the memory 170 as part of the frequency analysis parameters received in connection with block 305 of FIG. 3 and, as a result, the example amplitude controller identifies the output disturbance limit by reading the measurement noise value from the memory 170. In some examples, the measurement noise can be determined based on a known value for an ADC noise floor of the response collector 160. However, the example measurement noise value may be determined in any other fashion. For example, the measurement noise value may be calculated based on operational parameters of the response collector 160 (e.g., a number of ADC levels reported by the response collector 160, a frequency at which the response collector 160 samples the response of the digitally controlled power converter 190, etc.). In some examples, a scaling factor is applied to increase and/or decrease the measurement noise value.

The example amplitude controller 140 determines a mode of operation for controlling the injection disturbance (block 420). The mode of operation is stored in the memory 170 as part of the frequency analysis parameters received in connection with block 305 of FIG. 3 and, as a result, the example amplitude controller 140 identifies the mode of operation by reading the same from the memory 170. In examples disclosed herein, two example modes of operation are used, corresponding to the digitally controlled power converter 190 operating in a plant mode or an open loop mode. If the amplitude controller 140 is to operate in the plant mode (e.g., block 420 returns a result of PLANT), the example amplitude controller 140 determines a plant gain (H) measured at the immediately previous frequency step (block 430). In examples disclosed herein, the plant gain represents the gain component of the frequency response of the plant. However, any other approach to determining the plant gain (H) may be used such as, for example, averaging multiple measured plant gains for previous frequency steps (e.g., averaging the five most recent frequency steps within the frequency sweep). The example amplitude controller 140 calculates the next injection amplitude (block 440). In examples disclosed herein, the next injection amplitude is calculated using the measurement noise value and the value of the plant gain (determined in connection with block 430). For example, the next injection amplitude may be calculated as:

$$\hat{\imath}_n = \frac{(\text{measurement noise})}{H_{n-1}} \quad \text{Equation 4}$$

In equation 4, above, $\hat{\imath}_n$ represents the magnitude of the next injected disturbance; (measurement noise) represents the measurement noise determined in connection with block 410; and $H_{n-1}$ represents the measured gain of the plant transfer function at the prior frequency step (determined in connection with block 430). However, any other equation and/or calculation may be performed to determine the injection amplitude to be used at the next frequency step. Calculating the injection amplitude based on the measurement noise and the plant transfer function is important because such an approach enables the injection amplitude to be scaled based on the expected response of the digitally controlled power converter 190. For example, for a 1% error in measurement, the injection amplitude would need to be 100 times the ADC noise floor when plant gain (H) is 1. However, if the plant gain (H) were 10, the injection amplitude need only be 10 times the ADC noise floor for the same percentage error in measurement.

The example amplitude controller 140 applies minimum and/or maximum output disturbance limits to the calculated injection amplitude (block 450). In examples disclosed herein, the injection amplitude is clamped at a maximum value of 0.05% with respect to an operating reference point (e.g., the reference Ref of FIG. 2). Likewise, the injection amplitude is clamped at a minimum value of 0.0005% with respect to the operating reference (e.g., the reference Ref of FIG. 2). However, any other minimum and/or maximum values may additionally or alternatively be used. Clamping the injection amplitude ensures that, while the injection amplitude is scaled to reduce output disturbance, the injection amplitude is not allowed to become too great to allow interference with the steady state operation of the digitally controlled power converter, or allowed to become too low that no disturbance is injected. The example amplitude controller 140 then returns the injection amplitude such that the injection amplitude can be used in the subsequently injected disturbance.

Returning to block 420 of FIG. 4, if the amplitude controller 140 is to operate in the open loop mode (e.g., block 420 returns a result of OPEN LOOP), the example amplitude controller 140 determines the injection amplitude at a subsequent frequency step (block 460). In examples disclosed herein, the injection amplitude is determined using the open loop gain of the previous frequency step (e.g., estimate the next compensator gain based on the prior two measured compensator gains). In some examples, the injection amplitude is determined based on the open loop gain of the subsequent frequency as measured at a previously executed sweep (e.g., an open loop gain value stored in the memory 170). In some examples, when a first sweep is performed, an interpolation of the plant gain from the prior frequency step and a calculated value of the compensator gain (the compensator is known as it is implemented in the system already) can be used to determine the open loop gain, which in turn may be used to determine the injection amplitude. However, the expected open loop gain may be determined in any other fashion such as, for example, performing a lookup in the memory 170 to identify a measured compensator gain of a prior frequency sweep, assuming that the compensator gain for the next frequency step will be the same as the prior frequency step, etc.

The example amplitude controller 140 determines a plant gain (H) measured at the immediately previous frequency step (block 470). However, any other approach to determining the plant gain (H) may be used such as, for example, averaging multiple measured plant gains for previous frequency steps (e.g., averaging the five most recent frequency steps within the frequency sweep). The example amplitude controller 140 calculates the next injection amplitude (block 480). In examples disclosed herein, the next injection amplitude is calculated using the measurement noise value, the expected compensator gain (determined in connection with block 460), and the plant gain (determined in connection with block 470). In examples disclosed herein, the injection amplitude is calculated using the following equation:

$$\hat{\imath}_n = \frac{(\text{measurement noise})}{G_n \times H_{n-1}} \quad \text{Equation 5}$$

In equation 5, above, $\hat{\imath}_n$ represents the magnitude of the next injected disturbance; (measurement noise) represents the measurement noise determined in connection with block 410; $G_n$ represents the estimated compensator gain (determined in connection with block 460); and $H_{n-1}$ represents the measured gain of the plant transfer function at the prior frequency step (determined in connection with block 470). However, any other equation and/or calculation may be performed to determine the injection amplitude to be used at the next frequency step. In some examples, a value of the open loop gain GH measured from the previous frequency sweep can also be directly used. The example amplitude controller 140 applies minimum and/or maximum clamps to the calculated injection amplitude (block 450) to ensure that, while the injection amplitude is scaled to reduce output disturbance, the injection amplitude is not allowed to become too great to allow interference with the steady state operation of the digitally controlled power converter, or allowed to become too low that no disturbance is injected. The example amplitude controller 140 then returns the injection amplitude such that the injection amplitude can be used in the subsequently injected disturbance.

Figure 5:
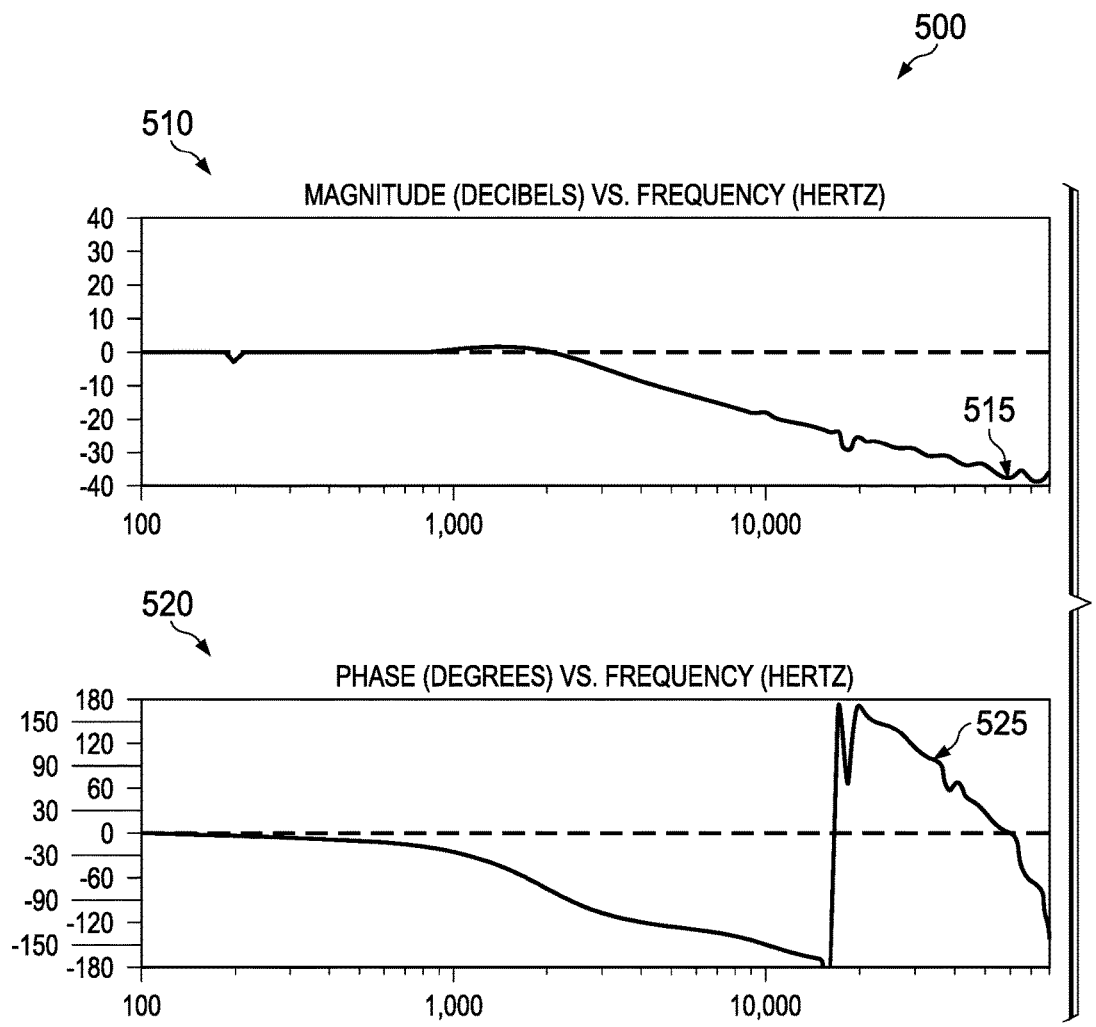
FIG. 5 is an example bode plot representing a result of a frequency response measurement without the use of the automatic control of the injection amplitude of FIG. 4.

FIG. 5 is an example bode plot 500 representing a result of a frequency response measurement without the use of the automatic control of the injection amplitude of FIG. 4. The example bode plot 500 includes a magnitude plot 510 and a phase plot 520. The example magnitude plot 510 displays a magnitude of a response (a vertical axis, in decibels) of the digitally controlled power converter 190 with respect to different input frequencies of the injected disturbance (a horizontal axis, in Hz). The example phase plot 520 displays a phase of the response (a vertical axis, in degrees) of the digitally controlled power converter 190 with respect to different input frequencies of the injected disturbance (a horizontal axis, in Hz). In the example magnitude plot 510 and the example phase plot 520, at higher frequencies, measurement error resulting from a fixed injection amplitude appears in the form of magnitude jitter 515 and phase jitter 525.

Figure 6:
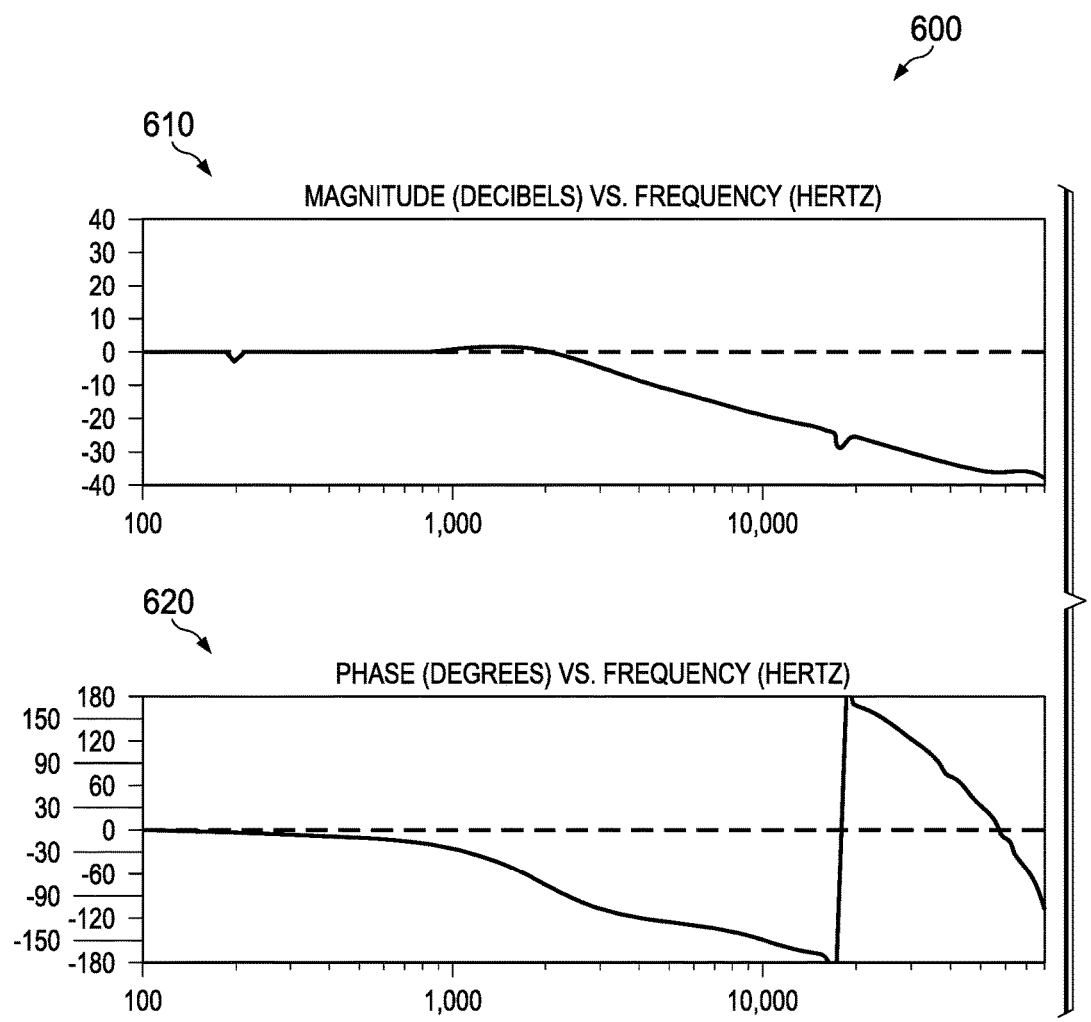
FIG. 6 is an example bode plot representing a result of a frequency response measurement utilizing the automatic control of the injection amplitude of FIG. 4.

FIG. 6 is an example bode plot 600 representing a result of a frequency response measurement utilizing the automatic control of the injection amplitude of FIG. 4. The example bode plot 600 includes a magnitude plot 610 and a phase plot 620. The example magnitude plot 610 displays a magnitude of a response (a vertical axis, in decibels) of the digitally controlled power converter 190 with respect to different input frequencies of the injected disturbance (a horizontal axis, in Hz). The example phase plot 620 displays a phase of the response (a vertical axis, in degrees) of the digitally controlled power converter 190 with respect to different input frequencies of the injected disturbance (a horizontal axis, in Hz). In the example magnitude plot 610 and the example phase plot 620, the corresponding measurements at higher frequencies do not exhibit magnitude jitter or phase jitter, as the automatic control of the injection amplitude results in a reduction in measurement error.

Figure 7:
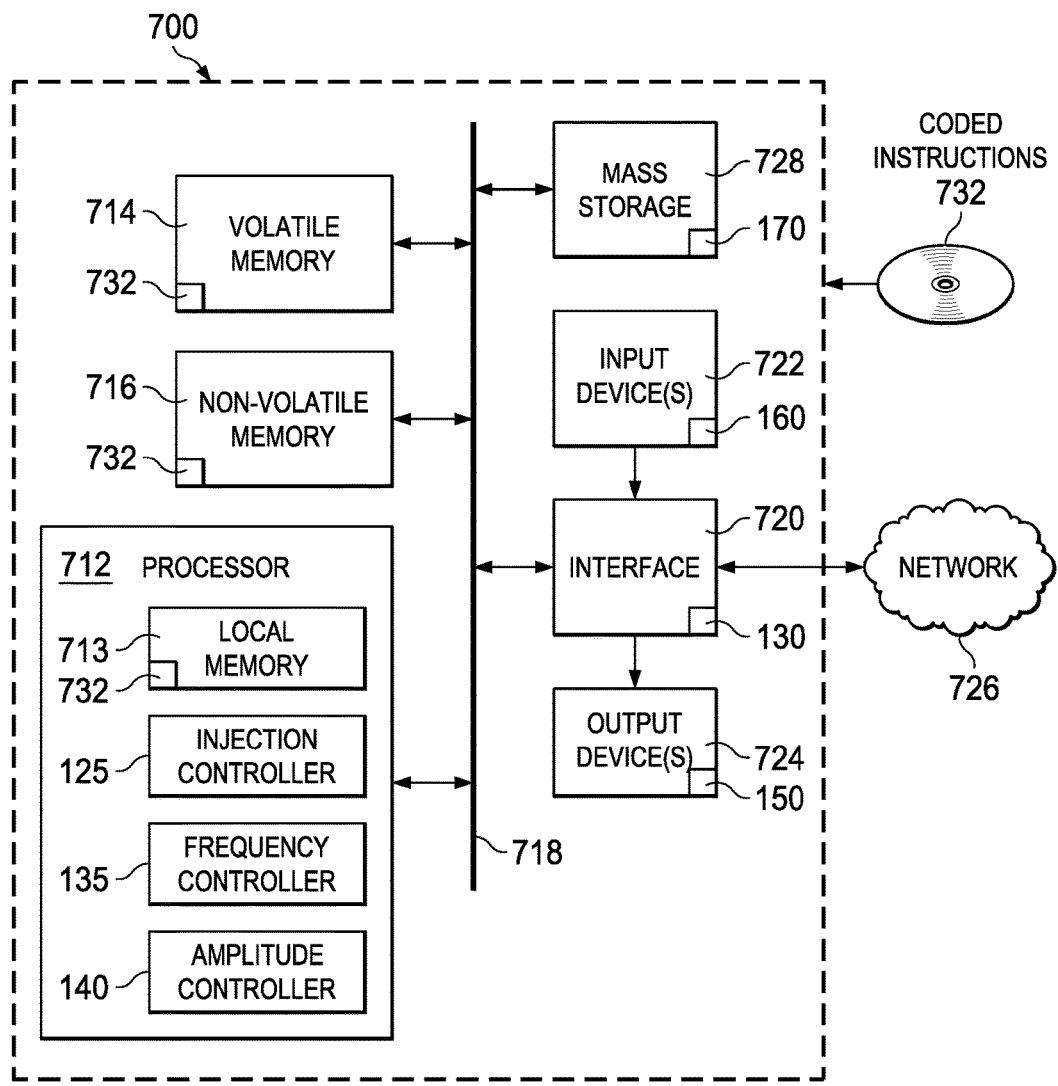
FIG. 7 is a block diagram of an example processor platform 700 capable of executing the instructions of FIGS. 3 and/or 4 to implement the example frequency response analyzer of FIG. 1.

FIG. 7 is a block diagram of an example processor platform 700 capable of executing the instructions of FIGS. 3 and/or 4 to implement the example frequency response analyzer 110 of FIG. 1. The processor platform 700 can be, for example, digital signal processor (DSP), an Internet appliance, a set top box, or any other type of computing device.

The processor platform 700 of the illustrated example includes a processor 712. The processor 712 of the illustrated example is hardware. For example, the processor 712 can be implemented by one or more integrated circuits, logic circuits, microprocessors or controllers from any desired family or manufacturer.

The processor 712 of the illustrated example includes a local memory 713 (e.g., a cache), and executes instructions to implement the example injection controller 125, the example frequency controller 135, and/or the example amplitude controller 140. The processor 712 of the illustrated example is in communication with a main memory including a volatile memory 714 and a non-volatile memory 716 via a bus 718. The volatile memory 714 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 716 may be implemented by flash memory and/or any other desired type of memory device. Access to the main memory 714, 716 is controlled by a memory controller.

The processor platform 700 of the illustrated example also includes an interface circuit 720. The interface circuit 720 may be implemented by any type of interface standard, such as an Ethernet interface, a universal serial bus (USB), and/or a PCI express interface. The example interface circuit 720 implements the example communications interface 130.

In the illustrated example, one or more input devices 722 are connected to the interface circuit 720. The input device(s) 722 permit(s) a user to enter data and commands into the processor 712. The input device(s) can be implemented by, for example, an analog to digital converter (ADC), a keyboard, a button, a mouse, a touchscreen, etc. The example input device(s) 722 implement the example response collector 160.

One or more output devices 724 are also connected to the interface circuit 720 of the illustrated example. The output devices 724 can be implemented, for example, by display devices (e.g., a light emitting diode (LED), an organic light emitting diode (OLED), a liquid crystal display, a cathode ray tube display (CRT), a touchscreen, a tactile output device, and/or speakers). The interface circuit 720 of the illustrated example, thus, typically includes a graphics driver card, a graphics driver chip or a graphics driver processor. The example output device(s) implement the example disturbance injector 150.

The interface circuit 720 of the illustrated example also includes a communication device such as a transmitter, a receiver, a transceiver, a modem and/or network interface card to facilitate exchange of data with external machines (e.g., computing devices of any kind) via a network 726 (e.g., an Ethernet connection, a digital subscriber line (DSL), a telephone line, coaxial cable, a cellular telephone system, etc.).

The processor platform 700 of the illustrated example also includes one or more mass storage devices 728 for storing software and/or data. Examples of such mass storage devices 728 include floppy disk drives, hard drive disks, compact disk drives, Blu-ray disk drives, RAID systems, and digital versatile disk (DVD) drives. The example mass storage devices 728 implement the example memory 170.

The coded instructions 732 of FIGS. 3 and/or 4 may be stored in the mass storage device 728, in the volatile memory 714, in the non-volatile memory 716, and/or on a removable tangible computer readable storage medium such as a CD or DVD.

From the foregoing, it will be appreciated that the above disclosed methods, apparatus and articles of manufacture enable frequency response analysis of digitally controlled power converters without the need for an external frequency response analyzer. The example frequency response analyzer disclosed herein enables identification of plant and open loop characteristics of a closed loop power converter. Such characteristics can be used to determine stability information of the closed loop power converter such as bandwidth, gain margin, and phase margin. When analyzing the characteristics of the power converter, an amplitude of an injection used in a frequency sweep is adaptively scaled to limit disturbances and/or measurement error. Reducing disturbances and/or measurement error produces more reliable results and, in turn, facilitates more expedient design of digitally controlled power converters.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A tangible non-transitory machine-readable storage device comprising instructions which, when executed, cause a machine to at least:
   calculate a gain of a circuit of a digitally controlled power converter, the gain calculated based on a measured response of the circuit to a first disturbance injected at a first frequency;
   identify a second frequency at which a second disturbance is to be injected into the circuit, the second frequency different from the first frequency;
   calculate an amplitude at which the second disturbance is to be injected into the circuit at the second frequency, the amplitude calculated based on a measurement noise value and the gain of the circuit at the first frequency; and
   inject the second disturbance into the circuit using the second frequency and the amplitude.

2. The tangible non-transitory machine-readable storage device of claim 1, wherein the gain is a plant gain, and wherein the amplitude is further calculated based on an expected compensator gain at a third frequency.

3. The tangible non-transitory machine-readable storage device of claim 2, wherein the third frequency is greater than the first frequency and greater than the second frequency.

4. The tangible non-transitory machine-readable storage device of claim 2, wherein the instructions, when executed, further cause the machine to determine the expected compensator gain by interpolating one or more compensator gains of one or more previously measured responses of the circuit.

5. The tangible non-transitory machine-readable storage device of claim 2, wherein the instructions, when executed, further cause the machine to determine the expected compensator gain by performing a lookup to identify a measured compensator gain corresponding to the third frequency as measured in a previously recorded frequency sweep.

6. The tangible non-transitory machine-readable storage device of claim 1, wherein the instructions, when executed, further cause the machine to clamp the amplitude between a maximum amplitude and a minimum amplitude.

7. The tangible non-transitory machine-readable storage device of claim 1, wherein the instructions, when executed, further cause the machine to calculate an open loop gain of the circuit in response to the injection of the second disturbance.

8. The tangible non-transitory machine-readable storage device of claim 7, wherein the instructions, when executed, further cause the machine to calculate a plant gain of the circuit in response to the injection of the second disturbance.

9. The tangible non-transitory machine-readable storage device of claim 8, wherein the instructions, when executed, further cause the machine to report the calculated open loop gain of the circuit in response to the injection of the second disturbance and the calculated plant gain of the circuit in response to the injection of the second disturbance to a computer system.

10. A method to control an injection for a frequency response measurement, the measurement comprising:
    calculating a gain of a circuit of a digitally controlled power converter, the gain calculated based on a measured response of the circuit to a first disturbance injected at a first frequency;
    identifying a second frequency at which a second disturbance is to be injected into the circuit, the second frequency different from the first frequency;
    calculating, by executing an instruction with a processor, an amplitude at which the second disturbance is to be injected into the circuit at the second frequency, the amplitude calculated based on a measurement noise and the gain of the circuit at the first frequency; and
    injecting the second disturbance into the circuit using the second frequency and the amplitude.

11. The method of claim 10, wherein the gain is a plant gain, and the amplitude is further calculated based on an expected compensator gain at a third frequency.

12. The method of claim 11, wherein the third frequency is greater than the first frequency and greater than the second frequency.

13. The method of claim 11, further including determining the expected compensator gain by interpolating one or more compensator gains of one or more previously measured responses of the circuit.

14. The method of claim 11, further including determining the expected compensator gain by performing a lookup to identify a measured compensator gain corresponding to the third frequency as measured in a previously recorded frequency sweep.

15. The method of claim 10, further including calculating an open loop gain of the circuit in response to the injection of the second disturbance.

16. The method of claim 15, further including calculating the plant gain of the circuit in response to the injection of the second disturbance.

17. The method of claim 16, further including reporting the calculated open loop gain of the circuit in response to the injection of the second disturbance and a calculated plant gain of the circuit in response to the injection of the second disturbance to a computer system.

18. An apparatus to control injection for frequency response measurement, the apparatus comprising:
    an injection controller to calculate a plant gain of a circuit of a digitally controlled power converter, the plant gain calculated based on a measured response of the circuit to a first disturbance injected at a first frequency;
    a frequency controller to identify a second frequency at which a second disturbance is to be injected into the circuit, the second frequency different from the first frequency;
    an amplitude controller to calculate an amplitude at which the second disturbance is to be injected into the circuit at the second frequency, the amplitude calculated based on a measurement noise and the plant gain of the circuit at the first frequency; and
    a disturbance injector to inject the second disturbance into the circuit using the second frequency and the amplitude.

19. The apparatus of claim 18, further including a communication interface to communicate with a computer system, the injection controller to calculate an open loop gain of the circuit in response to the injection of the second disturbance, the injection controller to report the calculated open loop gain of the circuit in response to the injection of the second disturbance and the calculated plant gain of the circuit in response to the injection of the second disturbance to a computer system.

20. The tangible non-transitory machine-readable storage device of claim 1, wherein the instructions, when executed, cause the machine to inject the first disturbance into the circuit at a first input of the circuit, and wherein the second disturbance is also injected into the circuit at the first input.

21. The method of claim 10, wherein the first disturbance is injected into the circuit at a first input of the circuit, and wherein injecting the second disturbance into the circuit includes injecting the second disturbance at the first input.

22. The apparatus of claim 18, wherein the circuit comprises a first input and the first disturbance and the second disturbance are injected into the circuit at the first input.

* * * * *